(12) United States Patent
Akutsu et al.

(10) Patent No.: US 7,123,350 B2
(45) Date of Patent: Oct. 17, 2006

(54) SUBSTRATE HOLDING DEVICE, SUBSTRATE PROCESSING APPARATUS USING THE SAME, AND METHOD FOR ALIGNING AND HOLDING SUBSTRATE

(75) Inventors: Kotaro Akutsu, Saitama (JP); Mitsuru Inoue, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 136 days.

(21) Appl. No.: 10/891,032

(22) Filed: Jul. 15, 2004

(65) Prior Publication Data

US 2005/0018168 A1 Jan. 27, 2005

(30) Foreign Application Priority Data

Jul. 24, 2003 (JP) ............... 2003-201088

(51) Int. Cl.
G03B 27/58 (2006.01)
G03B 27/42 (2006.01)

(52) U.S. Cl. .......................... 355/72; 355/53
(58) Field of Classification Search ................. 355/72, 355/75, 77, 53; 310/12; 356/399; 250/548
See application file for complete search history.

(56) References Cited

U.S. PATENT DOCUMENTS

| 5,040,431 A | 8/1991 | Sakino et al. ............... 74/479 |
| 5,117,121 A * | 5/1992 | Watanabe et al. ........... 307/130 |
| 5,253,012 A * | 10/1993 | Chiba et al. ................ 355/53 |
| 5,685,232 A | 11/1997 | Inoue ......................... 108/20 |
| 5,701,041 A | 12/1997 | Akutsu et al. ............... 310/12 |
| 5,717,482 A | 2/1998 | Akutsu et al. ............... 355/53 |
| 5,864,389 A | 1/1999 | Osanai et al. ............... 355/53 |
| 5,923,408 A * | 7/1999 | Takabayashi ................ 355/53 |
| 6,172,738 B1 | 1/2001 | Korenaga et al. ............ 355/53 |
| 6,809,802 B1 * | 10/2004 | Tsukamoto et al. .......... 355/72 |
| 2001/0006763 A1 * | 7/2001 | Tanaka ....................... 430/311 |
| 2001/0019472 A1 * | 9/2001 | Kanno et al. ................ 361/234 |
| 2002/0089655 A1 * | 7/2002 | Kida et al. .................. 355/72 |
| 2003/0020891 A1 * | 1/2003 | Tokita ........................ 355/53 |
| 2003/0164934 A1 * | 9/2003 | Nishi et al. .................. 355/72 |
| 2004/0114124 A1 * | 6/2004 | Hoeks et al. ................ 355/75 |
| 2004/0179323 A1 * | 9/2004 | Litman et al. .............. 361/234 |

FOREIGN PATENT DOCUMENTS

JP  2001-44093  2/2001

* cited by examiner

Primary Examiner—Rodney Fuller
Assistant Examiner—Kevin Gutierrez
(74) Attorney, Agent, or Firm—Fitzpatrick, Cella, Harper & Scinto

(57) ABSTRACT

A substrate holding device has a substrate holding unit and supporting elements movable to protrude from a substrate-holding surface of the substrate holding unit. The substrate holding unit holds the substrate in a predetermined state with a first holding force after relative positions of the substrate and the substrate holding unit are adjusted while the supporting elements lift the substrate off the substrate-holding surface. Before the relative positions of the substrate and the substrate holding unit are adjusted, the substrate holding device holds the substrate with a second holding force that is smaller than the first holding force and includes a zero holding force. Thus, the substrate holding device is able to align and hold the substrate in a short time.

17 Claims, 7 Drawing Sheets

SUBSTRATE HOLDING DEVICE, SUBSTRATE PROCESSING APPARATUS USING THE SAME, AND METHOD FOR ALIGNING AND HOLDING SUBSTRATE

BACKGROUND OF THE INVENTION

1. Field of the Invention

The present invention relates to a substrate holding device that holds a substrate, such as a wafer, during semiconductor fabrication and, in particular, a substrate holding device included in an exposure system for fabricating a semiconductor device.

2. Description of the Related Art

An exposure system used in fabrication of a semiconductor device or a liquid crystal display device includes a substrate holding device that holds an original plate, such as a mask or a reticle, and a substrate, such as a semiconductor wafer or a glass substrate, which is an object to be exposed (hereinafter simply referred to as "a substrate").

Japanese Patent Laid-Open No. JP2001-044093 discloses an example of such a known substrate holding device. In general, a wafer transferred to a stage is coarsely pre-positioned, and is thereafter fine positioned. In the above-described publication, a wafer is transferred to a wafer chuck after pre-alignment, and deviation from a reference alignment mark is calculated. If the resultant correction value of the wafer exceeds a maximum operating distance of a XYθ stage, the XYθ stage is moved to the maximum position, and the wafer is then transferred from the wafer chuck to a wafer receiving chuck (hereinafter referred to as "pins"). The XYθ stage moves back to the original position, and the wafer is then transferred back from the pins to the wafer chuck. This operation is repeated until the position of the wafer is corrected.

This substrate holding device, in which a wafer is transferred from the wafer chuck to the pins for every alignment correction of a deviation of the wafer, must wait until the wafer is released from the wafer chuck, since the wafer chuck always holds the wafer as tightly as it does during exposure. Also, if the pins strongly push up the wafer in order to reduce the waiting time, there is a possibility of the wafer being considerably offset from the proper position.

SUMMARY OF THE INVENTION

According to the present invention, a substrate holding device includes a substrate holding unit and supporting elements protruding from a substrate-holding surface of the substrate holding unit. The substrate holding unit holds a substrate in a predetermined state by a first holding force after the relative positions of the substrate and the substrate holding unit are adjusted while the supporting elements lift the substrate off the substrate-holding surface, and the substrate holding unit holds the substrate by zero holding force or a second holding force that is smaller than the first holding force before the relative positions of the substrate and the substrate holding unit are adjusted. Thus, the substrate holding device can align the substrate in a short time and hold it.

Preferably, the substrate holding device moves the substrate holding unit to a point for measuring a positional deviation of the substrate, while the substrate holding unit is holding the substrate by zero holding force or a second holding force, before the relative positions of the substrate and the substrate holding unit are adjusted. Thus, the substrate holding device can align the substrate with a reference coordinate in a short time.

Preferably, the substrate holding device moves the substrate holding unit to correct a positional deviation of the substrate from a reference coordinate and to align the substrate with the substrate holding unit. More preferably, the positional deviation is a deviation in the rotational direction. In this case, since a maximum rotation stroke is limited, adjustment of the positions of the substrate and the substrate holding unit is further required. Accordingly, the throughput is efficiently increased.

Additionally, the substrate holding device adjusts the relative positions of the substrate and the substrate holding unit a plurality of times and holds the substrate by the second holding force, which includes a zero holding force, before at least one of the adjustments. This increases the throughput. In this case, the throughput increases as the number of times the substrate is held by the second holding force or zero holding force increases.

In recent years, the wavelength of exposure light has been decreased in order to achieve exposure systems with high resolution. These shortened wavelengths require exposure in a vacuum atmosphere as an exposure environment. In a vacuum atmosphere, however, a wafer must be held with electrostatic attraction instead of vacuum attraction. Electrostatic attraction requires a considerable amount of time to release the wafer, thus decreasing the throughput. Accordingly, when the wafer is held with electrostatic attraction, the above-described structure can improve the throughput more efficiently.

The above-described substrate holding device may be applied to a substrate processing apparatus, an exposure system, and a method for fabricating a device.

According to another aspect of the present invention, a method for aligning a substrate with a reference position in a substrate processing apparatus includes the steps of mounting the substrate on a holding surface; holding the substrate on the holding surface by a second holding force smaller than a first holding force, which is used for holding the substrate during processing of the substrate; measuring a positional deviation of the substrate from the reference position; moving the substrate to correct the deviation while holding the substrate by the second holding force; lifting the substrate off the holding surface; moving the holding surface relative to the substrate; and transferring the substrate to the holding surface. Thus, the substrate processing apparatus can align the substrate in a short time and hold it.

According to another embodiment of the present invention, a substrate holding device comprises a holding unit that holds a substrate, measuring means for measuring a positional deviation of a substrate from a reference position, a control unit for adjusting the holding force of said holding unit, and an actuator for driving said holding unit in a predetermined range. The holding unit holds said substrate by a first holding force when said deviation is within said predetermined range. The holding unit holds said substrate by a second holding force, which is smaller than said first holding force, when said deviation is outside of said range.

Further objects, features and advantages of the present invention will become apparent from the following description of the preferred embodiments with reference to the attached drawings.

DESCRIPTION OF THE PREFERRED EMBODIMENTS

First Embodiment

Figure 1A:
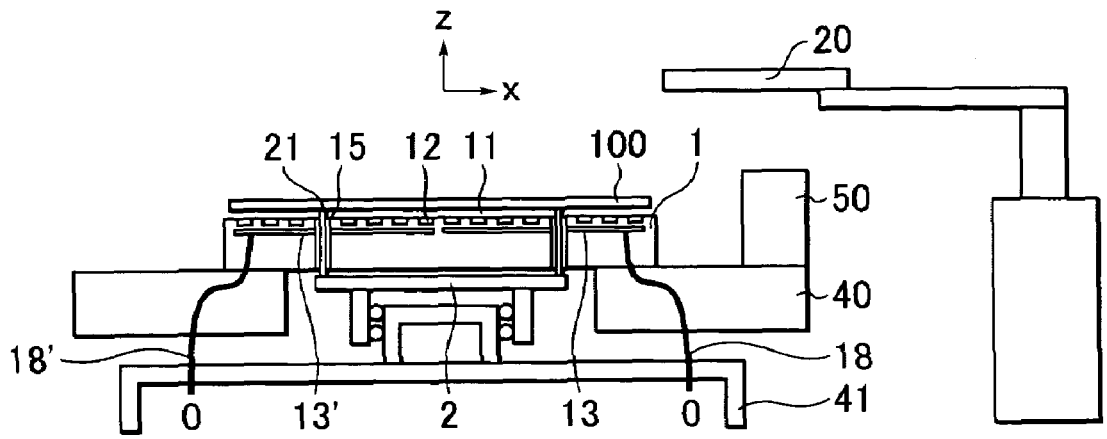
FIGS. 1A, 1B, and 1C show a substrate holding device according to a first embodiment of the present invention.

FIG. 1 shows a first embodiment of the present invention. A substrate holding device is included in an exposure system. The Z-axis is the direction of the optical axis of exposure light. The substrate holding device includes a top plate supporting table 41 mounted on a translation stage 60, shown in FIG. 5, which has a long stroke movement in the X and Y directions perpendicular to the Z-axis direction; a top plate 40 having short stroke movements in the Z direction and about the Z-axis with respect to the top plate supporting table 41; and a chuck 1 which is secured on the top plate 40 and serves as substrate holding means to hold a substrate or wafer 100. The top plate 40 includes a measurement mirror 50 for an interferometer 160, shown in FIG. 5, which is used to measure the position of the top plate 40.

The chuck 1 has three small through-holes 15, through which pins 21 are able to pass in the Z direction to function as a support for the wafer 100. The pins 21 are fixed to a pin driving unit 2, which is movably supported with respect to the top plate supporting table 41 in the Z direction. Accordingly, the pin driving unit 2 drives the pins 21 in the Z direction, independently from the chuck 1, by moving in the Z direction. The driving method is well-known, and therefore a detailed description is omitted.

Figure 1B:
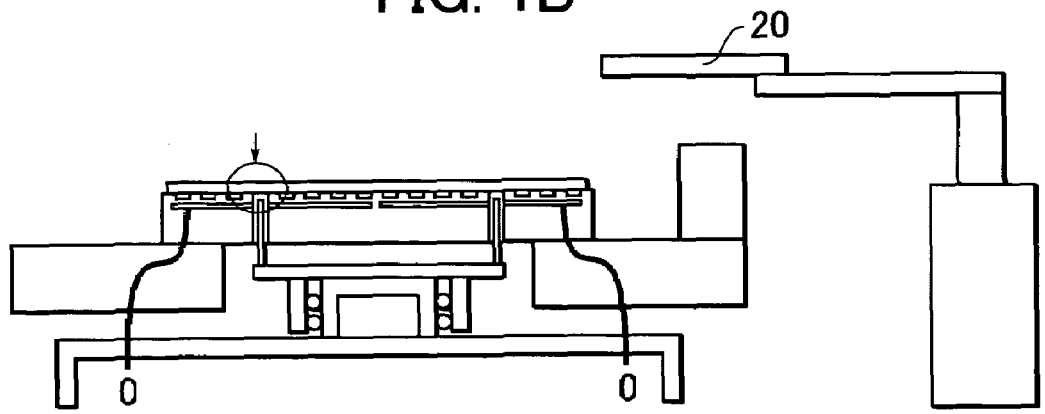
Figure 2:
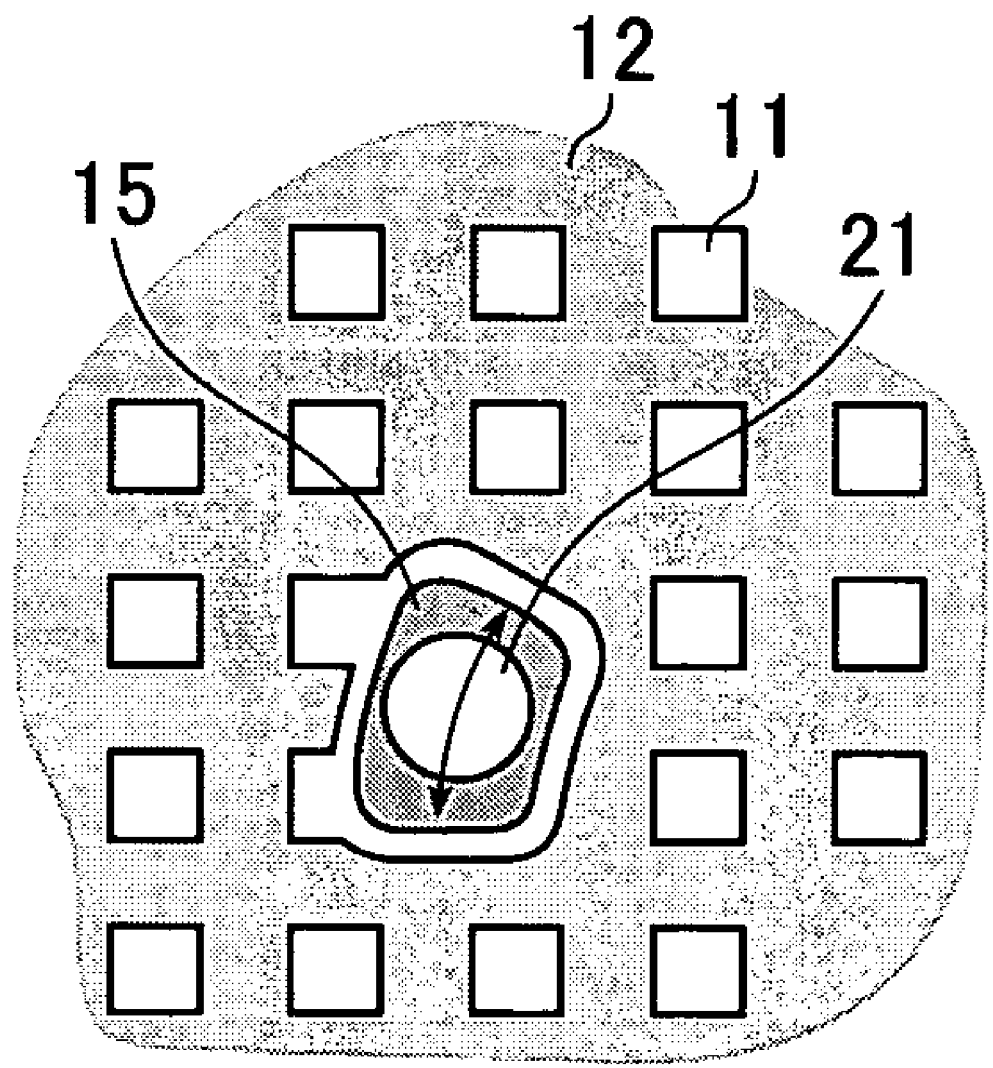
FIG. 2 is a view in the vicinity of a through-hole.

FIG. 2 is an enlarged view of one of the through-holes 15, viewed from the direction shown by the arrow in FIG. 1B. As shown in FIG. 2, the shape of the through-hole 15 provides the pin 21 with a moving allowance in the rotation direction of a wafer. The through-holes 15 are preferably small so as not to impair the flatness of the wafer 100 when the wafer 100 is attracted to the chuck 1. The chuck 1 has wafer holding segments 11, which are higher than a recess segment 12 by about 5 to 100 μm in the Z direction. The area of the wafer holding segment 11 is preferably as small as possible to prevent dust particles from accumulating between the wafer holding segments 11 and the wafer 100, when the wafer 100 is attracted to the chuck 1. Additionally, since too large a pitch of the wafer holding segments 11 in the X and Y directions causes deformation of the wafer 100, the pitch is preferably small.

Figure 1C:
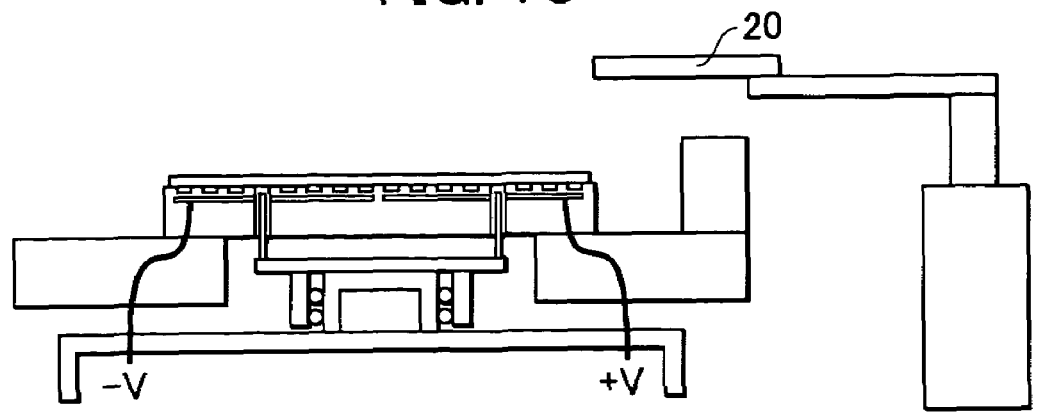

The chuck 1 is preferably a bipolar electrostatic chuck, in which polar plates 13 and 13' are embedded. Lead wires 18 and 18' are connected to the polar plates 13 and 13', respectively. Voltages +V and −V are applied to the polar plates 13 and 13', respectively, when the chuck 1 attracts the wafer 100 by electrostatic force, as shown in FIG. 1C.

In this embodiment, a bipolar electrostatic chuck is used. Alternatively, a single pole electrostatic chuck may be used. In this case, a conductive needle must be planted in the wafer 100 and the potential of the wafer 100 must be zero.

In addition, electrostatic chucks may be mounted on the top ends of the pins 21, which are surfaces that support the wafer 100, to hold the wafer 100, thus preventing the wafer 100 from shifting when the pins 21 support the wafer 100 above the wafer holding surface.

In this embodiment, the pins 21 are movable in the Z direction, but are not rotatable about the Z-axis. This is because rotating the pins about the Z-axis requires large through-holes 15, and therefore, the flatness of the wafer 100 is reduced when the chuck 1 attracts the wafer 100, as described above. The moving range of the top plate 40, on which the chuck 1 is mounted, in the Z direction is smaller than that of the pins 21. The top plate 40 is rotatable about the Z-axis.

The present invention is not limited to the above-described structure. For example, the pins 21 may be rotatable about the Z-axis and the moving range of the top plate 40 in the Z-direction may be large. That is, the wafer 100 only needs to rotate with respect to the chuck 1 after the wafer 100 is transferred from the chuck 1 to the pins 21. A mechanism to drive the top plate 40 is virtually identical to a mechanism that moves or drives the chuck 1.

Figure 3:
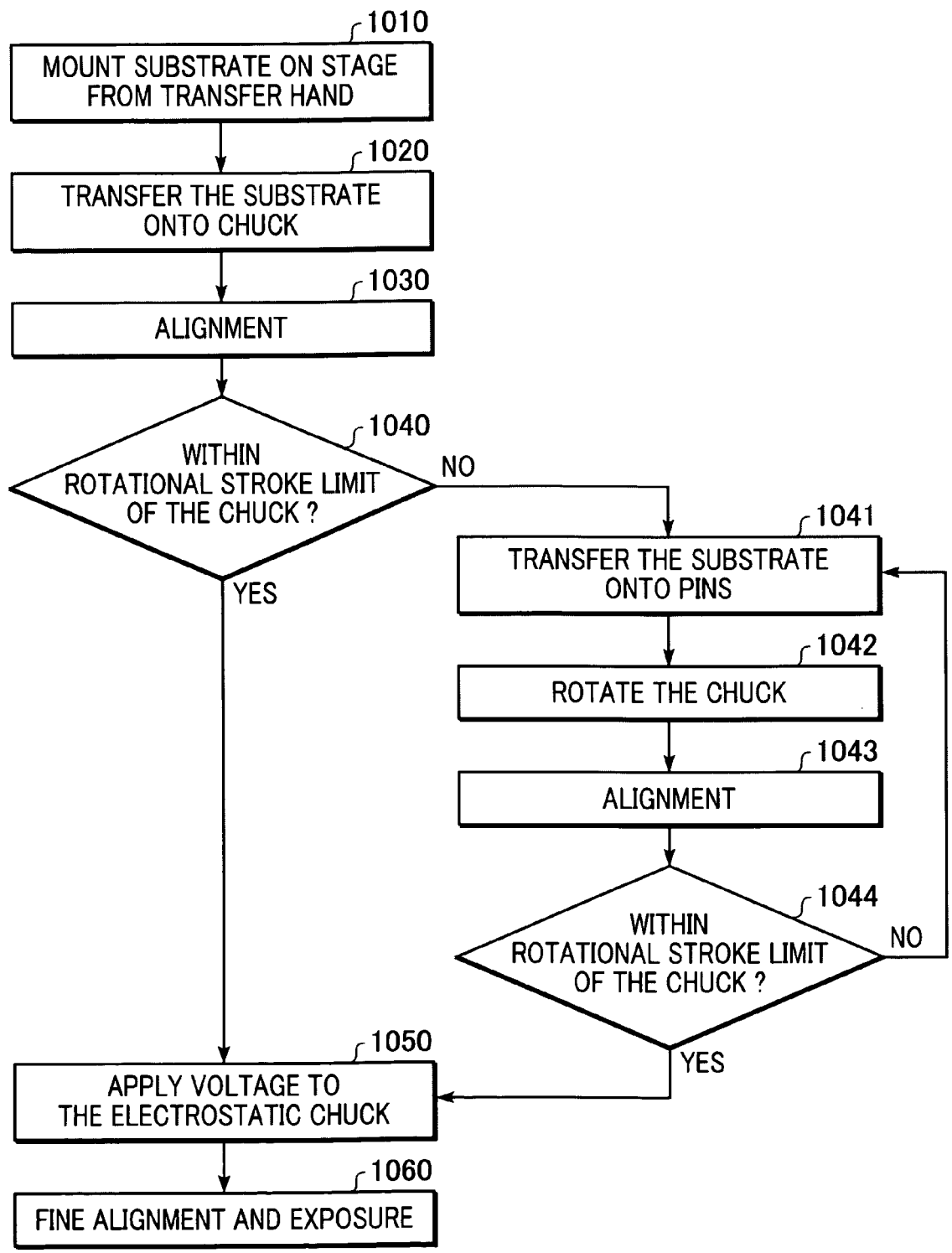
FIG. 3 is a flow chart showing a positioning sequence.

A procedure of wafer transfer will now be described with reference to FIG. 3.

The top plate supporting table 41 and the top plate 40 are moved along with the translation stage 60 to a position where the wafer is transferred. The wafer 100 is pre-aligned by using an orientation flat or a notch of the wafer 100, and the wafer 100 is then transferred to the position over the vicinity of the chuck 1 on the top plate 40 with the bottom surface of the wafer 100 being supported by a transfer arm 20. At this moment, the wafer holding surfaces (top ends) of the pins 21 protrude from the top surface (a wafer holding or chuck surface) of the chuck 1, as shown in FIG. 1A. Thus, the wafer 100 is transferred from the transfer arm (transfer hand) 20 to the wafer holding surfaces of the pins 21 at step 1010 shown in FIG. 3.

Subsequently, after the transfer arm 20 moves away from the position over the vicinity of the chuck 1, the wafer holding surfaces of the pins 21 are lowered in the Z direction under the wafer chuck surface, as shown in FIG. 1B. Thus, the wafer 100 is transferred from the pins 21 to the chuck 1 (at step 1020 shown in FIG. 3). In this case, the pins 21 only need to move up and down relative to the wafer chuck surface (top surface) of the chuck 1 and therefore, either one may be driven.

Figure 5:
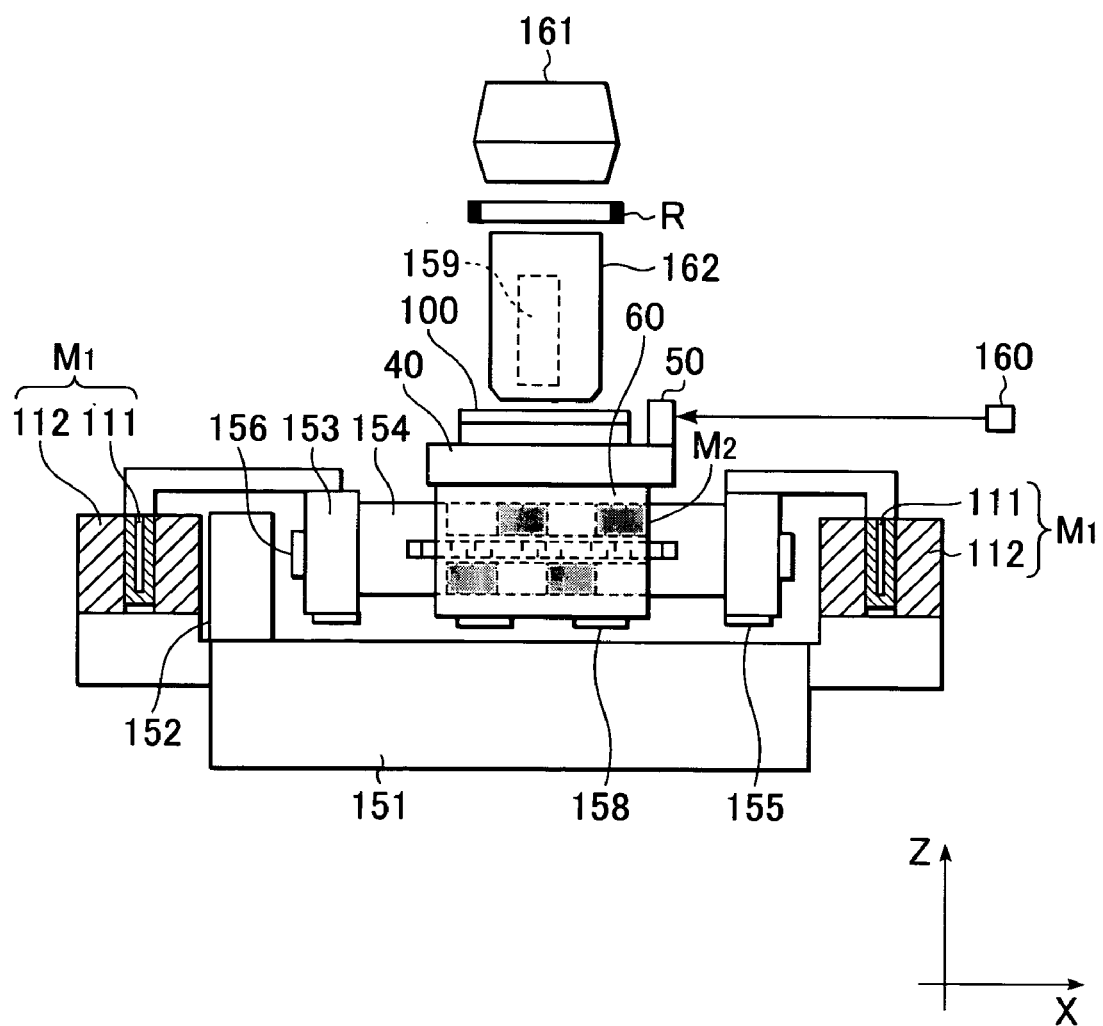
FIG. 5 shows an exposure system according to a second embodiment of the present invention.

After the wafer 100 is transferred from the pins 21 to the chuck 1, the top plate supporting table 41 moves in the X and Y directions along with the translation stage 60 to a position under an alignment scope 159, shown in FIG. 5, which is a position for a mark measurement. During the movement, the voltages +V and −V, which produce a first holding force to attract and hold the wafer in a final predetermined state, for example, virtually in the same state as an exposure state, are not applied to the electrostatic chuck (i.e. the polar plates 13 and 13'). Instead, small voltages +v and −v are applied to produce a second holding force smaller than the first holding force, where +v<V and −v>−V, or 0 V is applied, that is, no voltage is applied to make the second holding force zero.

The release time of the wafer can be decreased as the applied voltage decreases; however, care must be taken not to shift the substrate during movement. The deviation of the substrate is advantageously reduced in a vacuum.

Subsequently, an alignment step (step 1030) is performed, in which a coordinate pattern on the substrate is rotated to be aligned with a reference coordinate by measuring marks.

Figure 4A:
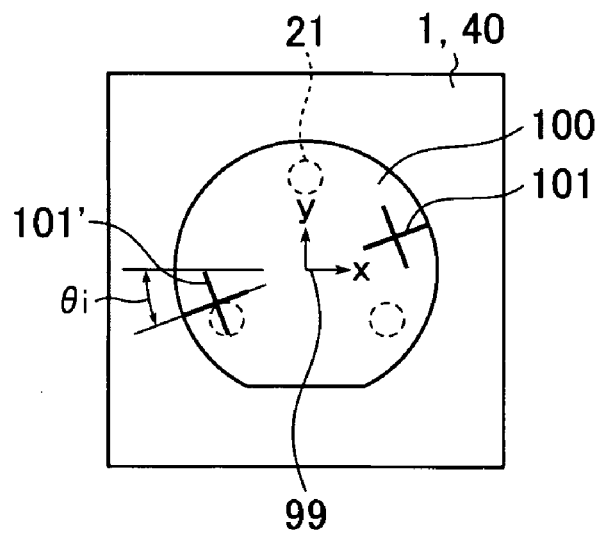
FIGS. 4A, 4B, 4C, and 4D show positions of a wafer and a chuck in the positioning sequence.

FIG. 4A shows positions of the wafer and the chuck when marks are measured. Two marks 101 and 101' are disposed on the wafer 100 and the marks are to be aligned with a reference coordinate 99. The pins 21 are shown by dotted lines. Although the wafer 100 is aligned by using an orientation flat, the wafer 100 is rotationally offset from the reference coordinate 99 by an angle $\theta i$. Consequently, to exactly align the wafer 100 with the reference coordinate 99, the chuck 1 on which the wafer 100 is mounted must be rotated along with the top plate 40.

Figure 4B:
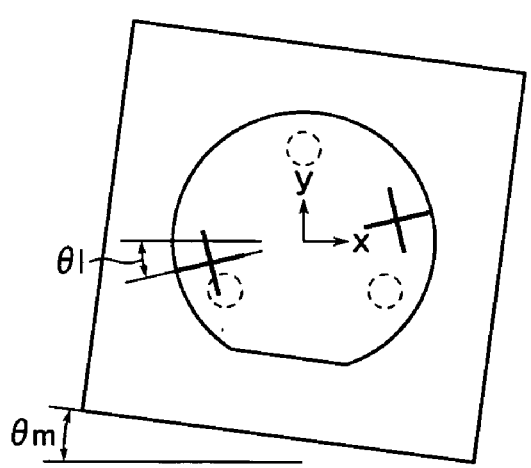

Unfortunately, the top plate 40 can rotate about the Z-axis only within a predetermined moving amount (a predetermined stroke). If the maximum rotation amount (rotation stroke) $\theta m$ is smaller than the rotational offset $\theta i$, a rotational amount $\theta 1(=\theta i-\theta m)$ remains uncorrected after one rotational movement, as shown in FIG. 4B. In this case, a halogen lamp irradiates two or more marks on the wafer and scattered light is detected by a CCD camera and is image-processed. The rotational offset $\theta i$ is then calculated to determine whether or not it can be corrected by one rotational movement (at step 1040). The above-described measuring method of the rotational offset is only an example and the method is not limited thereto.

If, at step 1040, the first determination indicates that the answer is "NO," the wafer 100 is rotated by the maximum amount while being held by the chuck 1. Subsequently, the pin driving unit 2 raises the pins 21 relative to the chuck 1 and the wafer 100 is then transferred from the chuck 1 to the top ends of the pins 21, which are wafer holding surfaces (at step 1042). At this moment, since no electrostatic force or very weak electrostatic force acts between the bottom surface of the wafer 100 and the wafer chuck surface, the release time is zero or very short. Therefore, the wafer 100 is transferred from the chuck 1 to the pins 21 in a short time.

Figure 4C:
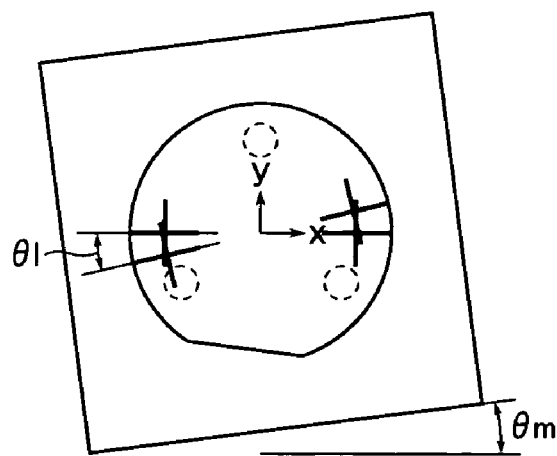

As shown in FIG. 4C, the chuck 1 and the top plate 40 are driven to rotate by an angle $-\theta m$ with the wafer 100 being held by the pins 21 (at step 1042). The relative position of the wafer 100 with respect to the chuck 1 and the top plate 40 is adjusted by this rotation. In this embodiment, the pins 21 are not rotated. Alternatively, the pins 21 may be rotated in the positive rotation direction along with the rotation of the chuck 1 if the pins 21 can be rotatably driven. This increases the rotation amount in one correction. After the chuck 1 is driven to rotate, the pin driving unit 2 moves down relative to the chuck 1 and the wafer 100 is transferred from the pins 21 to the chuck 1. In the case where the pins 21 are driven to rotate by some amount, the pins 21 rotate in the opposite direction by the same amount after transferring the wafer 100 to the chuck 1.

Subsequently, the remaining rotation amount $\theta 1$ is measured again (at step 1043) and it is determined whether or not the rotation amount $\theta 1$ can be corrected by a second rotational movement, that is, whether the angle $\theta 1$ is smaller than the angle $\theta m$ (at step 1044). If the answer is "NO," the wafer 100 and the chuck 1 are rotated again by the angle $\theta m$ and then the steps following step 1041 are performed again.

Figure 4D:
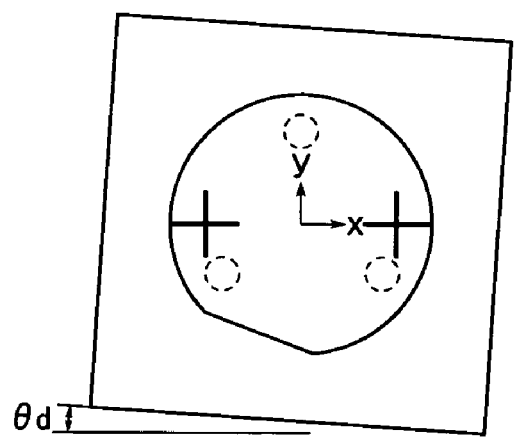

If, at step 1040 or step 1044, the answer is "YES," the chuck 1 (the top plate 40) rotates the wafer 100 by an angle $\theta 1$ ($\theta i$ in the case of step 1040). Thus, as shown in FIG. 4D, the wafer 100 is exactly aligned with the reference coordinate 99. The chuck 1 is rotated along with the top plate 40 by an angle $\theta d (=\theta 1-\theta m)$ ($\theta i$ in the case of step 1040) and subsequent processes follow. At this moment, the voltages +V and −V are first applied to the polar plates 13 and 13' of the electrostatic chuck, and therefore, the chuck 1 attracts the wafer 100 (at step 1050).

In this embodiment, although the measurement mirror 50 is mounted on the top plate 40 and rotationally moves about the Z-axis together with the top plate 40, Abbe error can be corrected since the rotation amount is exactly known.

Thus, the above-described processes of transferring and positioning of the wafer 100 are completed. The process then proceeds to, for example, a fine alignment and an exposure process while the chuck 1 is holding the wafer 100 by an electrostatic force (at step 1060).

In this embodiment, rotation offset is measured by moving the wafer 100, which is transferred from the transfer arm 20 at the transfer position, to the mark measuring position. However, by providing a mechanism that measures a rotation shift at the transfer position, the movement can be eliminated. In this case, since time required for the movement is eliminated and a position shift caused by the movement is reduced, the second holding force can be further reduced. As a result, the throughput is increased.

In this embodiment, at steps 1043 and 1044, the remaining rotation amount $\theta 1$ after the first rotation is measured and it is determined whether the amount $\theta 1$ is smaller than the rotational stroke $\theta m$. Thus, the measurement is performed for every transfer to obtain a more precise adjustment by eliminating the affect of a rotational shift occurring every transfer. The measurement of rotation shift and the determination processes at steps 1043 and 1044 may be omitted by calculating the number of corrections to adjust the rotational offset $\theta i$ at steps 1030 and 1040.

According to the embodiment, in the case where a plurality of positionings of the wafer 100 and the chuck 1 is performed, holding the wafer 100 by the second holding force or by zero force before at least one positioning increases the throughput.

Second Embodiment

FIG. 5 shows an exposure system using the substrate holding device, according to the present invention, for fabricating a semiconductor device.

The exposure system is used for fabricating semiconductor devices, such as a semiconductor integrated circuit, a micromachine, and a device having a fine pattern, such as a thin film magnetic head. The exposure system forms a desired pattern on a substrate by projecting exposure light, which is exposure energy emitted from a light source 161, onto a semiconductor wafer or substrate 100 through a reticle R, which is an original plate, and through a projection lens unit 162. As used herein, the term "exposure light" is a general term used to denote, for example, visible light, ultraviolet light, EUV light, X-rays, electron beams, and charged particle beams, and the term "projection lens" is a general term used to denote, for example, a refractive lens, a reflector lens, a refractive and reflector lens system, and a lens for charged particle beams.

In this exposure system, a guide 152 and linear motor stators 112 are fixed on a surface plate 151. Each linear motor stator 112 has a multi-phase magnetic coil. Each linear motor mover 111 has permanent magnets. The linear motor mover 111 is coupled with a moving segment 153, which is coupled with a movable guide 154. Thus, a linear motor M1 actuates the movable guide 154 to move it in the Y direction. The moving segment 153 is supported by hydrostatic bearings 155 and 156 with reference to the top surface of the surface plate 151 and a side surface of the guide 152, respectively.

The translation stage 60 is supported by a hydrostatic bearing 158 so as to cover the movable guide 154. The translation stage 60 is actuated by a linear motor M2 and moves in the X direction with reference to the movable guide 154. The top plate 40 is disposed on the translation stage 60. Movement of the stage 60 is measured by the measurement mirror 50, which is fixedly mounted on the top plate 40, and the interferometer 160.

The wafer 100 (substrate) is held on the chuck 1 mounted on the top plate 40. The light source 161 and the projection lens unit 162 reduce the pattern of the reticle R, which is an original plate, and transfer it to every divided area of the wafer 100 in a step-and-repeat or step-and-scan manner.

Third Embodiment

Figure 6:
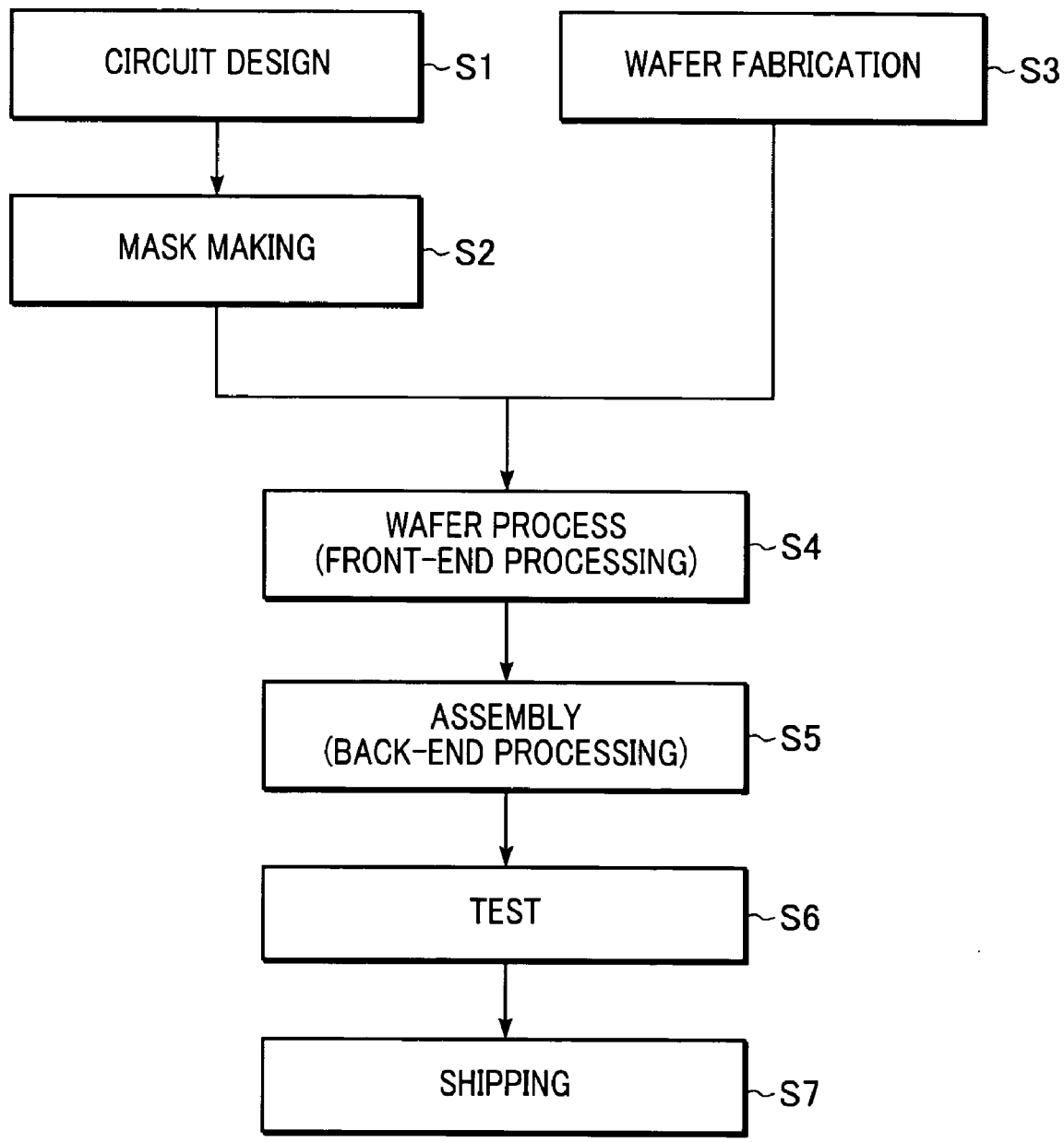
FIG. 6 shows a semiconductor fabrication process according to a third embodiment of the present invention.

A fabrication process of a semiconductor device using the exposure system will now be described. FIG. 6 is a flow chart of all the fabrication steps for a semiconductor device. At step S1 (circuit design), the circuit of the semiconductor device is designed. At step S2 (mask making), a mask is created based on a designed circuit pattern.

At step S3 (wafer fabrication), a wafer is fabricated using a material, such as silicon. At step S4 (wafer process), which is referred to as "front end processing," an actual circuit is formed on a wafer with the above-described exposure system by photolithography using the above-described mask. Subsequently, at step S5 (assembly), which is referred to as "back end processing," the wafer processed at step S4 is turned into semiconductor chips. This step includes an assembly sub-step (dicing and bonding) and a packaging sub-step (chip encapsulation). At step S6 (test), a functioning test and a durability test of a semiconductor device fabricated at step S5 are performed. After these steps, the semiconductor device is achieved and, at step S7, is shipped.

Figure 7:
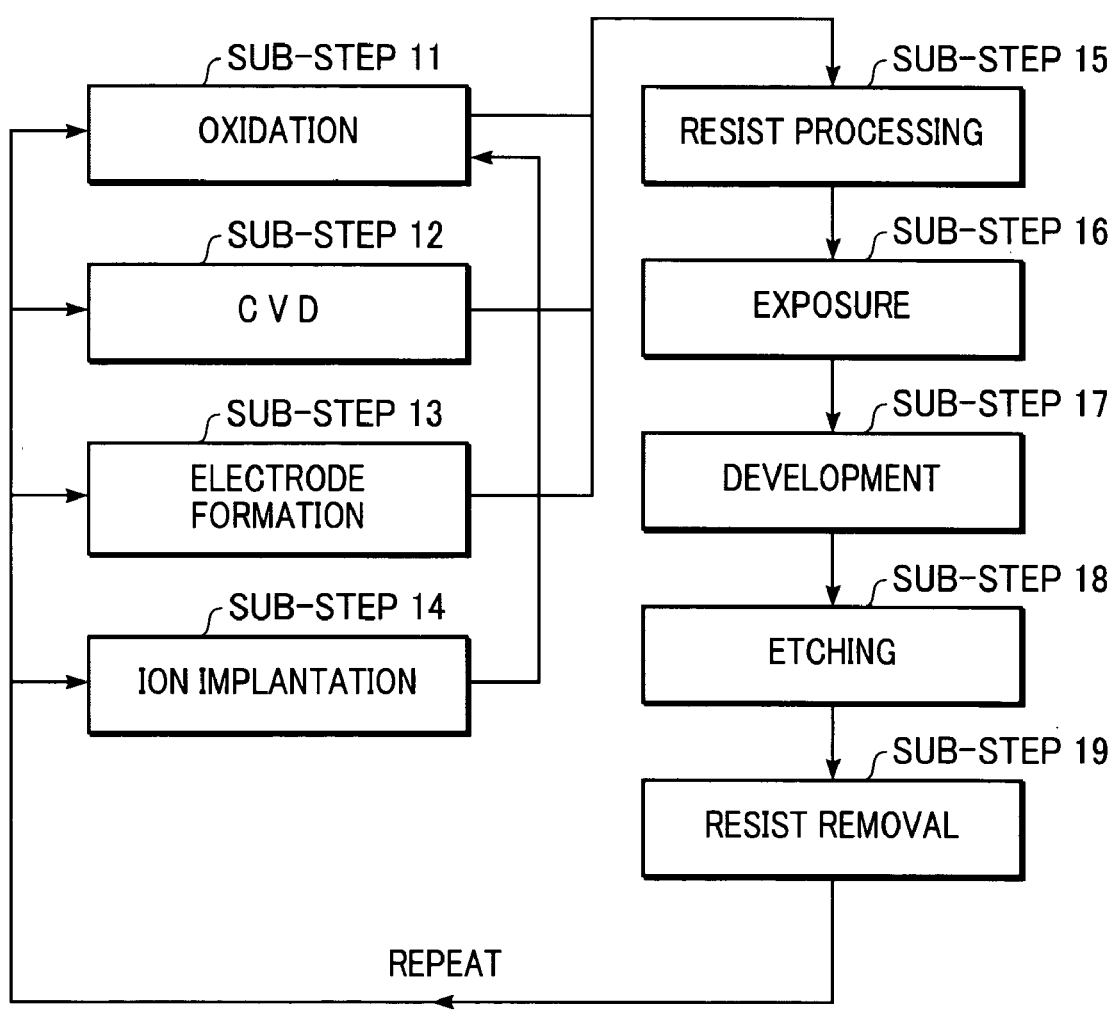
FIG. 7 shows a wafer process according to the third embodiment.

The wafer processing of step S4 includes the following sub-steps as shown in FIG. 7: an oxidation sub-step 11 in which a surface of a wafer is oxidized, a CVD sub-step 12 in which an insulating film is formed on the surface of the wafer, an electrode formation sub-step 13 in which electrodes are formed on the wafer by vapor deposition, an ion implantation sub-step 14 in which ions are implanted in the wafer, a resist processing sub-step 15 in which a photosensitive agent is coated on the wafer, an exposure sub-step 16 in which a circuit pattern is transferred to the wafer by the above-described exposure system after the resist processing, a development sub-step 17 in which the wafer exposed to light in the exposure sub-step 16 is developed, an etching sub-step 18 in which an area not covered by a developed resist image is stripped, and a resist removal sub-step 19 in which unnecessary remaining resist after etching is removed. These sub-steps are repeated to form multiple circuit patterns on the wafer.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims.

What is claimed is:

1. A substrate holding device, comprising:
   a substrate holding unit; and
   supporting elements protruding from a substrate-holding surface of the substrate holding unit,
   wherein a substrate is held in a predetermined state by a first holding force in response to an adjustment of relative positions of the substrate and the substrate-holding unit in a rotational direction with the supporting elements lifting the substrate off the substrate holding surface, and
   wherein the substrate is held by a second holding force smaller than the first holding force to initiate the adjustment of the relative positions of the substrate and the substrate-holding unit in the rotational direction.

2. The substrate holding device according to claim 1, wherein the substrate holding device moves the substrate holding unit to a point for measuring a positional deviation of the substrate, while the substrate holding unit is holding the substrate by the second holding force, before the relative positions of the substrate and the substrate holding unit are adjusted.

3. The substrate holding device according to claim 1, wherein the substrate holding device moves the substrate holding unit to correct a positional deviation of the substrate from a reference coordinate and to align the substrate with the substrate holding unit.

4. The substrate holding device according to claim 3, wherein the positional deviation of the substrate is a deviation in the rotational direction.

5. The substrate holding device according to claim 1, wherein the substrate holding device adjusts the relative positions of the substrate and the substrate holding unit a plurality of times and holds the substrate by the second holding force before at least one of the adjustments.

6. The substrate holding device according to claim 1, wherein the substrate holding unit holds the substrate by an electrostatic force.

7. A substrate processing apparatus, comprising:
   a substrate holding unit;
   supporting elements protruding from a substrate-holding surface of the substrate holding unit,
   wherein a substrate is held by a first holding force in response to an adjustment of relative positions of the substrate and the substrate-holding unit in a rotational direction with the supporting elements lifting the substrate off the substrate holding surface, and
   wherein the substrate is held by a second holding force smaller than the first holding force to initiate the adjustment of the relative positions of the substrate and the substrate-holding unit in the rotational direction; and
   wherein the substrate is held by the substrate holding unit.

8. An exposure system, comprising:
   an exposure unit;
   a substrate holding unit;
   supporting elements protruding from a substrate-holding surface of the substrate holding unit,
   wherein a substrate is held by a first holding force in response to an adjustment of relative positions of the substrate and the substrate-holding unit in a rotational direction with the supporting elements lifting the substrate off the substrate holding surface, and
   wherein the substrate is held by a second holding force smaller than the first holding force to initiate the adjustment of the relative positions of the substrate and the substrate-holding unit in the rotational direction; and
   a substrate being held by the substrate holding unit for exposure by the exposure unit.

9. A method for fabricating a device, comprising the steps of:
   providing an exposure system;
   placing a substrate in a substrate holding unit; and
   exposing the substrate, said exposure system comprising:

an exposure unit;

a substrate holding unit; and supporting elements protruding from a substrate-holding surface of the substrate holding unit, wherein a substrate is held by a first holding force in response to an adjustment of relative positions of the substrate and the substrate-holding unit in a rotational direction with the supporting elements lifting the substrate off the substrate holding surface, and wherein the substrate is held by a second holding force smaller than the first holding force to initiate the adjustment of the relative positions of the substrate and the substrate-holding unit in the rotational direction.

10. The method according to claim 9, further comprising a step of moving the substrate to a position where a positional deviation of the substrate from the reference position is measured, after holding the substrate with the second holding force.

11. The method according to claim 9, wherein the substrate is held by an electrostatic force.

12. A substrate holding device, comprising: a substrate holding unit; measuring means for measuring a positional deviation of a substrate from a reference position; a control unit for adjusting holding force of said holding unit; arid an actuator for driving said holding unit in a predetermined range, wherein said holding unit holds said substrate by a first holding force when said deviation is within said predetermined range, and said holding unit holds said substrate by a second holding force smaller than said first holding force when said deviation is outside of said range.

13. A substrate holding device, comprising:

a substrate holding unit;

measuring means for measuring a positional deviation of a substrate from a reference position in a rotational direction;

a control unit for adjusting holding force of said holding unit; and an actuator for driving said holding unit in the rotational direction, wherein said holding unit holds said substrate by a first holding force when said deviation in the rotational direction is within a driving range of said actuator, and said holding unit holds said substrate by a second holding force smaller than said first holding force when said deviation in the rotational direction is outside of said range.

14. A method for exposing a substrate comprising the steps of:

mounting the substrate on a holding unit:

moving the holding unit to a point position for performing alignment of the substrate;

aligning the substrate with a reference position; and exposing the substrate, wherein a holding force holding the substrate while the holding unit moves to a point the position for performing alignment of the substrate is smaller than a holding force holding the substrate while the substrate is exposed.

15. The method according to claim 14, the step for aligning the substrate includes a step for measuring a positional deviation of the substrate from the reference position in a rotational direction.

16. The method according to claim 15, the step for aligning the substrate includes a step for rotating the substrate or the holding unit while the substrate is lifted off the holding unit.

17. The method according to claim 16, the step for rotating the substrate or the holding unit includes a step for rotating the substrate or the holding unit while the substrate is mounted on a pin protruding from a holding surface of passing through the holding unit.

* * * * *